United States Patent [19]

McWilliams et al.

[11] 4,238,762
[45] Dec. 9, 1980

[54] ELECTRICALLY ISOLATED SEMICONDUCTOR DEVICES ON COMMON CRYSTALLINE SUBSTRATE

[75] Inventors: Donald A. McWilliams, Placentia; Charles H. Fa, Costa Mesa; George A. Larchian, Northridge; Oral F. Maxwell, Jr., Santa Ana, all of Calif.

[73] Assignee: Rockwell International Corporation, El Segundo, Calif.

[21] Appl. No.: 462,698

[22] Filed: Apr. 22, 1974

Related U.S. Application Data

[63] Continuation of Ser. No. 847,807, Jul. 25, 1969, abandoned, which is a continuation of Ser. No. 549,373, May 11, 1969, abandoned, which is a continuation of Ser. No. 327,990, Dec. 4, 1963, abandoned.

[51] Int. Cl.³ .................... H01L 27/04; H01L 27/12; H01L 29/04
[52] U.S. Cl. ........................................ 357/49; 357/50; 357/51; 357/59; 357/47
[58] Field of Search ...................... 357/49, 50, 47, 51, 357/59

[56] References Cited

U.S. PATENT DOCUMENTS 3,158,788  11/1964  Last .
3,290,753  12/1966  Chang .................................. 29/25.3
3,370,980  2/1968  Anderson .

OTHER PUBLICATIONS

Ultrapurification of Semiconductor Materials, *Proceed. of the Conf. on Ultrapurification of Semiconductor Materials*, Boston, Mass. Apr. 11–13, 1961, p. 34.
H. Wolf, *Semiconductors*, Wiley–Interscience, 1971, N.Y., p. 11.
J. C. Irvin, "Resistivity of Bulk Silicon and of Diffused Silicon" Bell. Syst. Tech. J., 41, 387 (1962).
Handbook of Chemistry and Physics, 55th Edition, 1974–1975, C.R.C. Press, p. B-30.

*Primary Examiner*—Stanley D. Miller, Jr.
*Attorney, Agent, or Firm*—H. Fredrick Hamann; H. J. Staas

[57] ABSTRACT

A semiconductor device comprises electrically isolated semiconductor segments embedded in a common crystalline substrate. Each of the semiconductor segments is electrically isolated from the other segments and from the substrate by an insulating film disposed therebetween. The substrate, the semiconductor segments, and the insulating film are thermally compatible over a wide temperature range, so that the insulating film also serves to effect a bond between the substrate and the segments.

36 Claims, 16 Drawing Figures

ELECTRICALLY ISOLATED SEMICONDUCTOR DEVICES ON COMMON CRYSTALLINE SUBSTRATE

This is a continuation of application Ser. No. 847,807 filed July 25, 1969, now abandoned; which is a continuation of Ser. No. 549,373 filed May 11, 1969, now abandoned, as a continuation of Ser. No. 327,990 filed Dec. 4, 1963, now abandoned.

This invention relates to electrically isolated semiconductor devices on a common crystalline substrate, and more particularly to segments or chips of a semiconductor embedded in a crystalline substrate, each electrically isolated from each other and from the substrate, for use in fabricating integrated circuits. The term "embedded" is employed herein to mean that each semiconductor segment is closely surrounded by the substrate on all sides except one which is purposely left exposed in order to be able to fabricate integrated circuit devices. However, even that side may be similarly enclosed as a final step of fabricating the integrated circuits without departing from this invention. An integrated circuit is defined as an electronic circuit which provides a function through the use of interconnected devices such as transistors, diodes, resistors and capacitors, each made from an electrically isolated semiconductor segment by any of the known techniques, including epitaxial crystal growth, oxidation, diffusion, evaporation, deposition and metalization in many different combinations.

It is common practice in the manufacture of integrated circuits to employ a common substrate for two or more circuit elements or devices fabricated in a semiconductor, and to electrically isolate the devices with a back-biased PN junction expressly provided for that purpose. When the devices of an integrated circuit are properly connected to sources of biasing potentials, the substrate, which now includes the diffused isolating region, is connected to a source of bias potential selected to provide back-biased junctions between the substrate and devices to be isolated.

The back-biased PN junctions provide electrical isolation because, as is commonly known, a back-biased junction restrains the flow of current through it. Consequently, no carriers cross the junction, except those thermally generated at the junction. If the ambient temperature is low, the reverse current due to the thermally generated carriers is negligible and the resistance across the junction is very high. However, the use of such a back-biased junction for isolating devices in an integrated circuit is not entirely satisfactory.

A major disadvantage of using a back-biased PN junction for isolation in an integrated circuit is that the ultimate circuit performance is severely limited by the parasitic capacitance associated with the junction. The charge density of the holes and electrons on opposite sides of the junction produce a potential variation across the junction in a manner analogous to the way in which an electric field is produced between the plates of a capacitor. Thus, owing to its geometry, the junction diode exhibits high capacitance which results in slow-speed circuit operation, and a low gain band-width product.

Another disadvantage of the back-biased PN junction of the prior art is that the substrate is thereby made an integral part of the circuit. That then gives rise to other problems, such as connecting the substrate to a heat sink, or chassis, because the junction may withstand only a limited reverse biasing voltage. If the limit is exceeded, even momentarily, the back-biased junction conducts heavily due to a phenonema referred to as avalanche multiplication of carriers generally understood to be a result of collision by higher velocity carriers in the higher electric field. Once the avalanche breakdown potential is reached, the integrated circuit will surely fail to function properly. Accordingly, the low voltage limitation of the back-biased junction technique for isolating devices imposes great limitations on the design of integrated circuits.

The use of back-biased PN junctions in some configurations also has a disadvantage of requiring a long material processing time to produce the isolating regions by diffusion of impurities through the semiconductor material.

An object of this invention is to provide a novel isolating region between segments of a semiconductor on a common substrate. This is accomplished in one embodiment by (1) selectively etching grooves in a high-grade semiconductor (out of which devices for an integrated circuit are to be fabricated) wherever electrical isolation is desired; (2) coating the etched side of the semiconductor, including the surfaces of the grooves, with a thin film of thermally compatible, electrically insulating material; (3) depositing a thermally compatible material on the insulating film, including the film in the grooves, to form a substrate for the semiconductor; and (4) lapping the exposed surface of the high-grade semiconductor until the substrate material in the isolating grooves is exposed. The insulating film may be provided by oxidizing or nitridizing the etched side of the semiconductor, including the surfaces of the grooves, or alternatively depositing thereon a film of a thermally compatible, electrically insulating material, as by pyrolytic or vapor deposition techniques. The substrate may also be alternatively produced by vapor deposition. The resulting structure comprises segments of the high-grade semiconductor embedded in a crystalline substrate with a film of electrically insulating material between the semiconductor segments and the substrate.

Other objects and advantages will become apparent from the following description with reference to the illustrations of a sample high-grade semiconductor divided into a plurality of electrically insulated segments on a common crystalline substrate.

Figure 1:
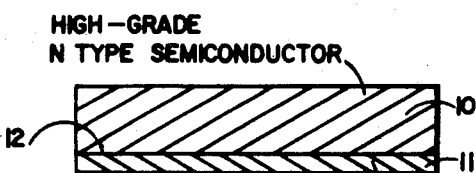
FIG. 1 is a cross-sectional view of at least a portion of a semiconductor having an interface of n and n+ type layers extending throughout.

In one embodiment of the invention, as illustrated in the drawings and described hereinafter with reference to specific examples of materials and processing techniques, the semiconductor is, for example, silicon with impurities of either the n or p type, or both. The semiconductor is selected to be a high-grade silicon wafer uniformly doped with impurities of the n type in one layer 10 and more heavily doped with the same type of impurities in a second layer 11 to form an interface 12. By starting with such a structure, the high-grade layer 10 may later be processed to form semiconductor devices such as diodes, transistors, etc., but not until after it has been suitably divided into electrically isolated segments in accordance with the present invention by isolating material in a desired pattern, such as the pattern 13 illustrated in FIG. 2. The more heavily doped lower layer 11 is desirable in the isolated segments for the fabrication of NPN transistors having low resistance in the collector region. For best results, the isolating material should consist of substantially the same material as the semiconductor or a compound thereof so that it will be thermally compatible with the semiconductor into which an integrated circuit is to be fabricated. By thermal compatibility it is meant that the characteristics of the respective materials are matched closely enough so that stresses, strains, separations or fractures will not result, either in the isolating material or the semiconductor, and the structure and functioning of the circuit fabricated therein is not impaired as a consequence of wide variations in processing and other environmental temperatures in the range expected to be encountered in process steps employed to fabricate integrated circuit elements in the isolated semiconductor segments, such as room temperature to the high temperature of approximately 1300° C. employed for diffusing impurities of selected conductivity types in the semiconductor segments, and in the range below room temperature to approximately −200° C. which may be encountered in some environments. Thus, in accordance with the illustrated embodiment of the invention, the material selected for the isolating regions is substantially intrinsic silicon, but electrically insulated from the layer of silicon 10 by a thin film 20 of silicon dioxide or silicon nitride. However, other thermally compatible materials may be selected which exhibit high electrical resistance, and which may be vapor deposited, such as alumina or beryllium oxide.

In the following description of an exemplary process by which the invention is achieved, frequent reference will be made to a semiconductor of which silicon is but one example. Accordingly, the term "semiconductor" as applied herein is to be interpreted in its broadest sense to include not only silicon and germanium, the two most widely used semiconductors for such devices as diodes, transistors, resistors and capacitors employed in integrated circuits, but also such other semiconductors as may be suitably adapted to the fabrication of devices for integrated circuits, such as gallium arsenide, gallium phosphide, indium antimonide, cadmium sulfide and other intermetallic compounds.

Figure 2:
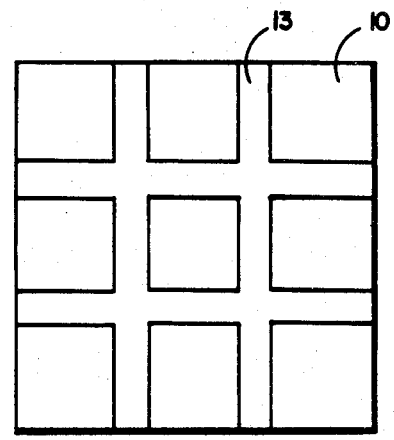
FIG. 2 is a plan view of the semiconductor of FIG. 1 showing a typical pattern of isolating regions desired in the semiconductor of FIG. 1.

To provide the isolating material in the pattern 13 of FIG. 2 by the process illustrated, one face of the semiconductor wafer, shown as the bottom face in FIG. 1, is first oxidized to an oxide thickness of approximately 10,000 Å, preferably by a dry oxidizing process, such as by placing it in a heated (1100° C.) environment of oxygen and very little or no water. The resulting film 20 is illustrated in FIG. 2 as silicon dioxide ($SiO_2$) but it should be understood that it may also be any compatible insulating material which may be produced or vapor deposited as a thin film. For instance, a nitride of the semiconductor, namely silicon nitride ($Si_3N_4$, $Si_3N_2$, SiN), may be provided by a thermal dissociation reaction of anhydrous ammonia in a nitrogen gas atmosphere. An alternative method is to heat the silicon (1100° C.) in a mixture of silicon tetrachloride and anhydrous ammonia vapors in a hydrogen gas atmosphere in varying proportions depending upon the nitride composition desired.

It should be noted that both silicon dioxide and silicon nitride can be deposited on other semiconductors, such as germanium, indiumantimonide, gallium-arsenide, etc., by pyrolytic decomposition of organic compounds of silicon. Examples of organic compounds are tetraethoxysilane for silicon dioxide and trichlorosilio-zine for silicon nitride. The important characteristic of the dioxide or nitride film is high impedance to the flow of electricity, regardless of how produced in order to provide an electrically insulating film.

Since the semiconductor is to be divided into electrically isolated segments in a desired pattern, it is necessary to etch isolating grooves into the semiconductor in the isolating regions between the segments. This may be accomplished by using standard techniques. Such techniques may consist of first spin-coating the surface of the oxide film 20 with a photosensitive and chemical resistive emulsion and exposing the emulsion to activating rays of light, such as ultra-violet light, through a negative of the desired pattern 13 (FIG. 2) to be etched. The latent image of the pattern is then developed in the emulsion by fixing the exposed emulsion and washing away the unexposed emulsion, thereby leaving a photo-resist mask for the etching process. It should be understood that a symmetrical pattern is employed for simplicity in the illustration. In actual practice the pattern will depend upon the design of the integrated circuit the elements of which are to be fabricated in the isolated segment.

Figure 4:
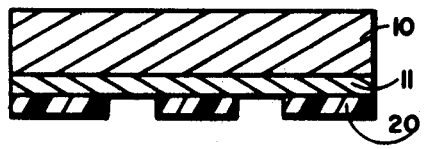

A suitable etchant is employed to dissolve exposed regions of the film 20, as illustrated in FIG. 4, using the photo-resist mask just described. For the film of silicon dioxide, a suitable etchant is a buffered solution of hydrofluoric acid.

Figure 5:
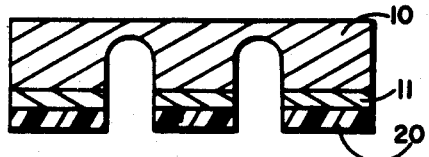

The next step illustrated in FIG. 5 consists of etching grooves in the semiconductor, with a suitable etchant which dissolves the semiconductor more rapidly than the oxide or nitride film. The depth of the etch is controlled in order to leave sufficient material along the upper surface of the layer 10 to hold the structure together for further processing.

The following table illustrates some of the semiconductors which may be employed and the etchants suitable for the material selected.

| Semiconductor | Etchants Inactive with $SiO_2$ | |
| --- | --- | --- |
| Si | HCl Vapor | Catechol:Hydrazine (1:10) |
| Ge | HCl Vapor | KOH or NaOH Solution |
| GoAs | $H_2O_2$:$H_2SO_4$:$H_2O$ (1:3:1) | $HNO_3$:HCl (1:1) |
| GaP | $HNO_3$:HCl (1:1) | NaOH Solution |
| InSb | $HNO_3$:HCl (1:1) | $HNO_3$ (Concentrated) |

Figure 3:
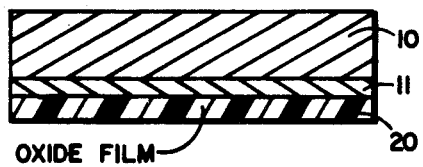
FIGS. 3 to 9 are views similar to FIG. 1 illustrating succeeding steps of but one process for providing the desired isolating regions in accordance with the present invention.

Etchants for those semiconductors which are inactive with silicon nitride are nitric acid, hydrofluoric acid and acetic acid, with other neutral buffering agents. As noted before, certain chemical resistive emulsions can be used for selective etching of all semiconductors. Thus, by using suitable photo-resists and etchants, the initial oxidizing and etching steps illustrated in FIGS. 3 and 4 may be omitted.

Figure 8:
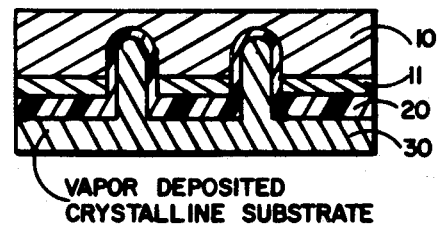
Figure 6:
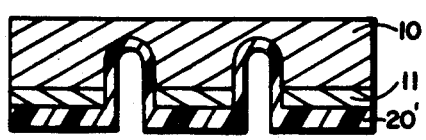

In the next step depicted in FIG. 6, the semiconductor etched in the preceding step is first cleaned and then oxidized to a thickness of approximately 10,000 Å. The entire oxide film 20', including that in the etched grooves, is then coated with a mixture containing a hydrocarbon or colloidal carbon dissolved in a suitable solvent which leaves an even distribution of organic matter. Upon being baked in a high temperature oven, the organic matter decomposes to form free carbon particles which in turn immediately react at elevated temperatures (approximately 1100° C.) with the silicon of the silicon dioxide film to form silicon-carbide particles 25 which serve as growth nucleation centers for a crystalline substrate 30 (FIG. 8). Although the organic or carbon particles 25 are not essential, they have been found to be desirable in order to achieve a rapid, initial coverage of uniform, high-resistivity, crystalline deposit which adheres firmly to the oxide film.

It should be noted that FIGS. 1 to 9 are intended to illustrate but one embodiment of the invention in the various steps of preparation by only one exemplary process, and that the dimensions shown are not proportional.

Figure 7:
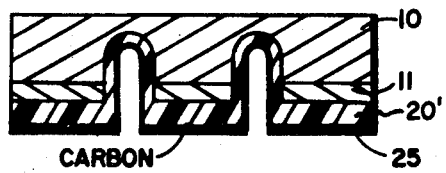

To deposit the silicon substrate 30 of FIG. 8, the structure of FIG. 7 is placed in a heated furnace with the silicon-carbide particles exposed to a gas stream which is initially hydrogen gas ($H_2$). The temperature of the structure is raised to approximately 1100° C., at which time a large quantity of vaporous silicon tetrachloride ($SiCl_4$) is added to the hydrogen gas stream. Under those conditions, a rapid growth of silicon ensues from each nucleating particle of silicon carbide. The process is allowed to continue until approximately 0.005 inch of crystalline substrate has been deposited. The structure is then cooled in a stream of hydrogen gas and removed from the furnace. Thereafter, the surface of the deposited crystalline substrate 30 is lapped until it is parallel to the oxide film which separates it from the semiconductor material.

It must be realized that a wide variety of hydrocarbons in suitable organic solvents may be used in preparing the silicon dioxide surface so that at elevated temperatures (1100° C. to 1300° C.) the siliconcarbide particles can be readily formed. In addition, the application of colloidal carbon or graphite in a wide variety of suitable organic solvents may be used in a similar manner to prepare the silicon dioxide surface for the vapor deposition of a crystalline substrate.

In the final step, the surface of the top layer 10 of the semiconductor is lapped until the vapor deposited crystal in the grooves or isolating regions is exposed in the pattern of FIG. 2. It is now apparent that the resulting structure consists of a plurality of semiconductor segments 35 embedded in a crystalline substrate 30 with an insulating film 20 isolating the segments from each other and from the substrate. For instance, in the illustrated example of FIG. 9, segments of n type silicon are embedded in a substrate of vapor deposited silicon with a film of silicon dioxide between the segments and the substrate. The silicon dioxide film constitutes an electrical insulator having very high electrical resistance and being thermally compatible with silicon over a very large temperature range.

An alternative method of providing a crystalline substrate is by deposition of any material having high impedance to electrical conduction, but low impedance to thermal conductivity, and a coefficient of linear thermal expansion compatible with that of the oxide or nitride film, and the semiconductor. For instance, a substrate of alumina ($Al_2O_3$) may be vapor deposited in a vacuum on the oxide film 20' of FIG. 6. Another compatible material which may be readily vapor deposited is beryllium oxide (BeO).

It should be noted that for the purpose of this invention, the techniques of depositing substrates of any of the materials mentioned, including alumina and beryllium oxide, may be referred to generally as vapor deposition, even though for some materials a vacuum is preferred as the environment for the operation.

Figure 9:
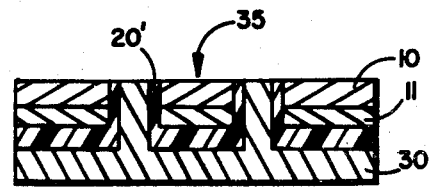

A principal advantage of the structure illustrated in FIG. 9 is that capacitance between the semiconductor segments and the crystalline substrate is greatly reduced because the crystalline substrate need not be electrically connected to the semiconductor segments to provide back-biased junctions for electrical insolation. Thus, it may be seen that the devices fabricated in the segments, such as transistors, are electrically isolated from each other by a good insulator, silicon dioxide, and embedded in a very compatible substrate of the same material. Another distinct advantage is that the metal base of a container to which the substrate is connected does not become electrically connected to the integrated circuit. In that manner, good thermal conduction from the integrated circuit may be provided to the metal base without establishing an electrical connection therebetween. This is true because the silicon dioxide film is very thin and presents very low thermal resistance but very high electrical resistance.

An inherent overall advantage of electrically isolating the semiconductor devices in accordance with the present invention is that the circuits formed by interconnecting such devices through existing techniques can be designed without regard to biasing potentials relative to the substrate or breakdown voltages between the devices and the substrate. In that manner an extraordinary number of design problems normally experienced are eliminated. On the other hand, the structure of FIG. 9 in no way changes the established techniques for producing interconnecting and semiconductor devices because once the semiconductor segments are isolated, the fabrication of the semiconductor devices and integrated circuits is in accordance with present practices. For example, a device, such as a diode, may be fabricated through the existing techniques of oxidation, photo-etching, and diffusion. After the device has been fabricated, non-rectifying, low-resistance contacts are provided to which connections are made or required to other devices to form an integrated circuit.

The first steps consist of providing for external connections and hermetically sealing the structure in a metal container, taking care to provide a good thermal junction between only the substrate of the integrated circuit and the base of the container. When the integrated circuit is put into use, its container may in turn be thermally connected to a heat sink, thereby providing good conduction of heat away from the integrated circuit.

Figure 10:
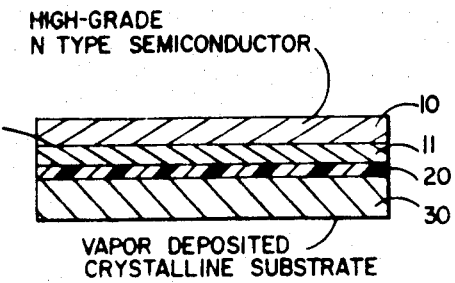
FIGS. 10 to 16 are similar to FIGS. 3 to 9 illustrating succeeding steps of a second embodiment of the invention.
Figure 11:
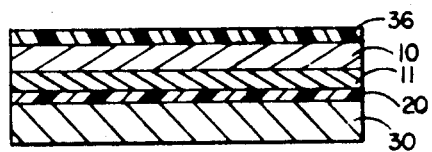

The second embodiment will now be described with reference to FIGS. 10 to 16, in which the reference numerals designate the same corresponding parts of the embodiment described with reference to FIGS. 1 to 9. The structure illustrated in FIG. 10 is first prepared by providing an insulating film 20' of silicon dioxide on a high-grade semiconductor diffused with n type impurities in one layer 10 and with a greater concentration of the same type of impurities in a layer 11 to form an interface 12. A silicon substrate 30 is deposited on the insulating film 20' in the same manner as described hereinbefore with reference to FIGS. 7 and 8 for the first embodiment.

It should be noted that, as with the first embodiment, various ones of different materials may be selectively used at each step provided only that they be thermally compatible.

Figure 12:
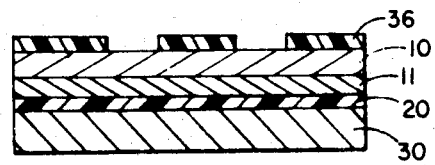
Figure 13:
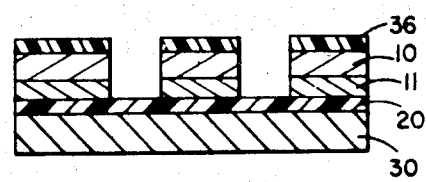

The surface of the layer 10 is then lapped and a silicon dioxide layer 36 deposited or otherwise provided. Isolating grooves are then etched as illustrated in FIGS. 12 and 13 in the same manner as described with reference to FIGS. 4 and 5 of the first embodiment.

Since an etchant is employed which dissolves the semiconductor more rapidly than the silicon dioxide, such as a solution or hydrofluoric acid, a substantial portion of the silicon dioxide film 20' may be left exposed at the bottom of the grooves, but that is of no consequence, since the objective is simply to isolate segments of the semiconductor.

Figure 14:
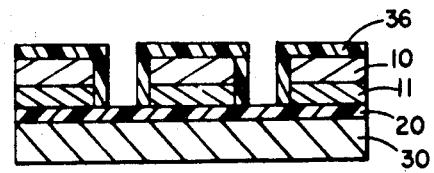
Figure 15:
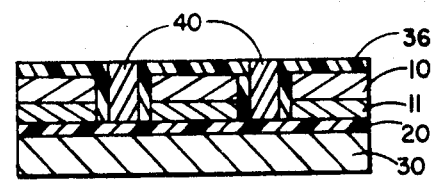
Figure 16:
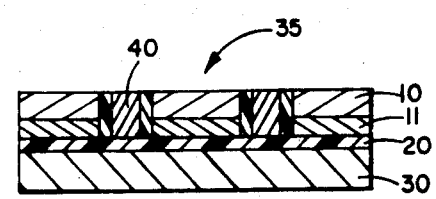

A silicon dioxide film 36' is then formed on the semiconductor segments exposed in walls of the grooves as illustrated in FIG. 14. Thereafter, silicon 40 is vapor deposited in the grooves by first providing in the grooves silicon-carbide nucleating particles in a manner similar to that described with reference to FIGS. 7 and 8 for the first embodiment. The silicon 40 thus deposited effectively forms an integral part of the substrate 30 since only the thin film 20' of silicon dioxide separates them.

In the final step, the top of the structure is lapped to expose the semiconductor, thereby providing semiconductor segments 35 embedded in a crystalline substrate of silicon with a film of electrically isolating silicon dioxide 20',37 between them, just as in the first embodiment illustrated in FIG. 9, except that the substrate is comprised of the base portion 30 and the isolating portion 40. Accordingly, for both the embodiment of FIG. 9 and the embodiment of FIG. 16, the semiconductor segments 35 are said to be embedded in a crystalline substrate with a film of electrically isolating material therebetween.

While the principles of the invention have now been made clear in two illustrative embodiments, there will be immediately obvious to those skilled in the art many modifications in structure, arrangement, processes, proportions and materials. The appended claims are therefore intended to cover and embrace any such modifications, within the limits only of the true spirit and scope of the invention.

We claim:

1. A semiconductor element comprising, a common electrically insulating, polycrystalline substrate selected from the class of electrically insulating refractory compounds having high thermal conductivity, said substrate being substantially free of semiconductor oxides, and
   a plurality of monocrystalline semiconductor segments separated from each other, said substrate forming a base for supporting said segments,
   said substrate having a portion thereof interposed between adjacent segments so that said segments are embedded in said substrate in spaced, electrically insulated relationship to each other,
   said segments being formed of a material which is crystallographically distinct from said substrate but thermally compatible therewith.

2. The semiconductor element recited in claim 1 wherein said polycrystalline substrate is $Al_2O_3$.

3. The semiconductor element recited in claim 1 wherein said polycrystalline substrate is BeO.

4. A semiconductor device comprising,
   a common substrate formed of a polycrystalline, insulating material,
   a plurality of segments formed of a monocrystalline semiconductor material, and
   electrically insulating means disposed between each of said segments, and between said substrate and said segments,
   said electrically insulating means disposed between said substrate and said segments effecting a bond between said substrate and said segments,
   said insulating material, said semiconductor material and said insulating means being thermally compatible over a wide temperature range.

5. A semiconductor element comprising a common, insulating, substrate base and a plurality of monocrystalline semiconductor segments, said substrate forming a base for supporting said segments and including a substrate portion interposed between adjacent segments so that said segments are embedded in said substrate in spaced relationship, a thin insulating film disposed between each of said segments and said substrate so that said segments are electrically insulated from each other and said substrate, said segments, film and substrate being thermally compatible.

6. The semiconductor element of claim 5 wherein said film is selected from the class consisting of oxides of silicon, beryllium, and aluminum and nitrides of silicon and germanium.

7. The semiconductor element of claim 5 wherein said substrate is an inorganic electrically insulating crystalline material selected from the class consisting of the refractory compounds of germanium, silicon, beryllium and aluminum.

8. The semiconductor element of claim 5 wherein said substrate base is an insulating form of a crystalline semiconductor.

9. A semiconductor structure having insulating isolation between circuit devices thereof, said semiconductor structure comprising, a plurality of discrete single crystal semiconductor islands, each island having at least one semiconductor device therein, a common substrate for said semiconductor islands having recesses therein, and insulating material of a material different from the material of the substrate in each of said recesses and between each of said semiconductor islands and the common substrate for electrically isolating said islands from each other on the bottom and each side of each island, with said insulating material being intimately bonded both to the said common substrate and to the semiconductor island for which it is provided, and means connecting said semiconductor devices into the circuit of the integrated circuit structure.

10. In a semiconductor structure, the combination of a plurality of islands each having four sides, a bottom and a top, at least one discrete semiconductor device in each island, a common substrate for the islands, insulating isolation material of a material different from said common substrate in a film-like portion for each island within the substrate and entirely encompassing the island on the four sides and the bottom thereof and extending to the top of the island at the surface of the substrate to insulatingly isolate each said island from each other said island in the semiconductor structure, said common substrate having recesses therein receiving said islands with the insulating isolation material encompassing the same and also having raised portions extending upwardly between said islands, metallized contact means at the top portion of each device to make connections to preselected portions thereof, and electrical connecting means between metallized contact means of said discrete semiconductor devices providing a predetermined circuit pattern for the semiconductor structure.

11. An integrated circuit structure having insulating isolation means for active and passive semiconductor devices therein, comprising a plurality of single crystal semiconductor islands therein having four sides and a bottom portion, each island including therein at least one semiconductor device, a polycrystalline substrate common to said islands, and a film of electrically insulating material of a material different from said substrate for each said island which is intimately bonded to said substrate and to a single crystal semiconductor island within said substrate on the four sides and the bottom of the island to insulatingly separate said plurality of islands from one another and correspondingly insulatingly isolate the semiconductor devices, said substrate having recesses therein receiving said island with the electrical insulating material thereon and having raised portions extending between said islands.

12. The integrated circuit structure of claim 11 in which said electrical insulating material is an oxide.

13. The integrated circuit structure of claim 11 in which said polycrystalline substrate is silicon, and said electrical insulating material is silicon dioxide.

14. The integrated circuit structure of claim 11 in which said single crystal semiconductor devices are of silicon, said common substrate is of polycrystalline silicon, and said electrical insulating material is silicon dioxide.

15. The integrated circuit structure of claim 11 in which said semiconductor devices are silicon, said substrate is aluminum oxide and said electrical insulating material is silicon dioxide.

16. A semiconductor having insulating isolation, comprising a single crystal silicon element having at least one circuit device therein, a polycrystalline silicon supporting structure supporting said semiconductor element, and a silicon dioxide film between and intimately bonded to said supporting structure and to said single crystal silicon element, said supporting structure having a recess therein receiving said element with the film bonded thereto and having raised portions extending upwardly along the sides of the element.

17. A semiconductor structure having insulating isolation, comprising a single crystal semiconductor element having a circuit device therein, a supporting structure having thermal expansion characteristics compatible with said semiconductor element, and insulating material at the interface between said semiconductor element and said supporting structure intimately bonded to both for electrically isolating said semiconductor element from said supporting structure, said insulating material comprising an oxide of said semiconductor element, and said supporting structure comprising a polycrystalline form of said semiconductor element, said supporting structure having a recess therein receiving said element with the insulating material thereon and having raised portions extending upwardly along the sides of said element.

18. In a semiconductor structure, a plurality of discrete single crystal semiconductor islands, said islands having surfaces lying in a substantially common plane, each of said islands having at least one semiconductor device formed therein and having contact areas extending to said surface, a common substrate for said semiconductor islands and insulating material disposed between each of said semiconductor islands and the common substrate for electrically isolating said islands from each other and from said substrate, said insulating material being intimately bonded to said common substrate and to the semiconductor islands, said substrate having recesses therein receiving said islands with said insulating material bonded thereto and having raised portions extending upwardly between said islands, said common substrate providing a support for said islands and said islands being carried thereby so that said surfaces of said islands face away from said common substrate and means connecting the contact areas of said semiconductor devices into an integrated circuit structure.

19. A semiconductor structure as in claim 18 wherein said support structure has thermal expansion characteristics compatible with said semiconductor islands and wherein said insulating material is formed of a material which can withstand normal diffusion and epitaxial growth temperatures to permit said semiconductor devices to be formed by diffusion or epitaxial growth.

20. A semiconductor structure as in claim 18 wherein said semiconductor islands are formed of single crystal silicon, wherein said common substrate is formed of polycrystalline silicon and wherein said insulating material is formed of silicon dioxide.

21. In a semiconductor structure, a support structure, a plurality of discrete semiconductor islands mounted on the support structure, said islands having surfaces lying in a substantially common plane and facing away from said support structure, and insulating material formed of a material different from the support structure intimately bonded to said support structure and said islands and electrically isolating said islands from each other and from the support structure, said support structure having recesses therein receiving said islands with said insulating material bonded thereto and having raised portions extending between the islands, said insulating material capable of withstanding temperatures required for diffusion of impurities into said island.

22. A semiconductor structure as in claim 21 wherein the support structure has a surface lying in substantially the same plane as said common plane.

23. A semiconductor structure in claim 21 wherein said islands have a substantially uniform depth.

24. A semiconductor structure as in claim 21 wherein the insulating material is formed in a layer.

25. A semiconductor structure as in claim 21 wherein the insulating material extends at least to said surfaces of the islands.

26. A semiconductor structure as in claim 21 wherein the support structure is formed of a semiconductor material.

27. A semiconductor structure as in claim 21 wherein the support structure is formed of polycrystalline silicon wherein the islands are formed of monocrystalline silicon and wherein the layer of insulating material is formed of silicon dioxide.

28. A semiconductor structure as in claim 21 in which at least one of the islands includes an epitaxially grown layer.

29. In a semiconductor structure, a support structure having a grid structure formed in one surface thereof, insulating material of a material different from the support structure disposed on the support structure to form an additional grid structure bonded to the first named grid structure and said support structure, a plurality of islands of semiconductor material embedded in the additional grid structure and electrically isolated from each other and from the support structure, said support structure providing support for said islands of semiconductor material.

30. A semiconductor structure as in claim 29 wherein the islands of semiconductor material have surfaces in which devices are formed and wherein they have a substantial portion thereof of one conductivity and the remaining portion thereof of different conductivity.

31. A semiconductor structure as in claim 29 wherein certain of the islands have surfaces lying in a common plane, and wherein the insulating material extends to a level in said common plane.

32. In a semiconductor structure, a semiconductor body of monocrystalline silicon, a layer of insulating material formed of silicon dioxide disposed on the body, and a support structure formed of polycrystalline silicon disposed on the insulating material, said support structure being formed with a grid structure with said layer of insulating material overlying said grid structure, said semiconductor body being recessed within said layer of insulating material, said semiconductor body, said layer and said support structure being intimately bonded together to form a solid unitary mass.

33. A semiconductor structure as in claim 32 wherein the semiconductor body has a substantial portion thereof of one conductivity and wherein the remaining portion thereof is of opposite conductivity.

34. In a semiconductor structure a support structure having recesses formed therein, a layer of insulating material different from the material of the support structure and bonded to the support structure so that at least all surfaces forming the recesses are covered by the layer of insulating material, said recesses in said support structure and said layer of insulating material having dimensions such that recesses remain within the confines of the insulating material, and a plurality of islands of semiconductor material, one of said islands being disposed in each of the recesses within the confines of the insulating material so that the islands are isolated from each other and from the support body.

35. A semiconductor structure as in claim 34 in which the support structure is formed of aluminum oxide.

36. A semiconductor structure as in claim 34 in which the support structure is formed of a beryllium oxide.

* * * * *